United States Patent
Pang

(10) Patent No.: US 9,091,935 B2
(45) Date of Patent: Jul. 28, 2015

(54) MULTISTAGE EXTREME ULTRA-VIOLET MASK QUALIFICATION

(71) Applicant: Dino Technology Acquisition LLC, Milpitas, CA (US)

(72) Inventor: Linyong Pang, Los Gatos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 261 days.

(21) Appl. No.: 13/794,330

(22) Filed: Mar. 11, 2013

(65) Prior Publication Data

US 2014/0254913 A1  Sep. 11, 2014

(51) Int. Cl.
G06K 9/00 (2006.01)
G03F 1/70 (2012.01)
G06T 7/00 (2006.01)

(52) U.S. Cl.
CPC . *G03F 1/70* (2013.01); *G06T 7/001* (2013.01); G06T 2207/10056 (2013.01); G06T 2207/30148 (2013.01)

(58) Field of Classification Search
None
See application file for complete search history.

(56) References Cited

U.S. PATENT DOCUMENTS

| | | |
|---|---|---|
| 5,640,199 A | 6/1997 | Garakani et al. |
| 6,042,998 A | 3/2000 | Brueck et al. |
| 6,235,434 B1 | 5/2001 | Sweeney et al. |
| 6,480,285 B1 | 11/2002 | Hill |
| 6,484,306 B1 | 11/2002 | Bokor et al. |
| 6,563,566 B2 | 5/2003 | Rosenbluth et al. |
| 6,709,792 B2 | 3/2004 | Nakao |
| 6,871,337 B2 | 3/2005 | Socha |
| 6,873,720 B2 | 3/2005 | Cai et al. |
| 6,925,202 B2 | 8/2005 | Karklin et al. |
| 7,003,755 B2 | 2/2006 | Pang et al. |
| 7,043,071 B2 | 5/2006 | Qian et al. |

(Continued)

FOREIGN PATENT DOCUMENTS

| | | |
|---|---|---|
| DE | 102007 028172 B3 | 11/2008 |
| JP | 2009 010373 | 1/2009 |

(Continued)

OTHER PUBLICATIONS

Written Opinion issued by USPTO, mailed Mar. 25, 2008, in Luminescent Technologies, Inc. International Application No. PCT/US07/078913, "Photo-Mask and Wafer Image Reconstruction" filing date Sep. 19, 2007.

(Continued)

*Primary Examiner* — Anand Bhatnagar
*Assistant Examiner* — Soo Park
(74) *Attorney, Agent, or Firm* — Kwan & Olynick LLP

(57) ABSTRACT

A technique for inspecting, qualifying and repairing photo-masks for use at extreme ultra-violet (EUV) wavelengths is described. In this technique, multiple images of a substrate and/or a blank that includes multiple layers deposited on the substrate are measured and compared to identify first potential defects. Using information associated with the first potential defects, such as locations of the first potential defects, another image of the EUV photo-mask that includes a mask pattern defined in an absorption layer, which is deposited on top of the multiple layers, is measured. Based on the other image and the first potential defects, second potential defects in the EUV photo-mask are identified. Next, a qualification condition of the EUV photo-mask is determined based on the first potential defects and the second potential defects.

20 Claims, 11 Drawing Sheets

(56) References Cited

U.S. PATENT DOCUMENTS

| | | |
|---|---|---|
| 7,057,709 B2 | 6/2006 | Rosenbluth |
| 7,073,162 B2 | 7/2006 | Cobb et al. |
| 7,093,226 B2 | 8/2006 | Pang |
| 7,093,229 B2 | 8/2006 | Pang et al. |
| 7,107,573 B2 | 9/2006 | Yamazoe et al. |
| 7,124,394 B1 | 10/2006 | Abrams et al. |
| 7,152,219 B2 | 12/2006 | Pang |
| 7,178,127 B2 | 2/2007 | Abrams et al. |
| 7,231,628 B2 | 6/2007 | Pack et al. |
| 7,254,251 B2 | 8/2007 | Cai et al. |
| 7,302,090 B2 | 11/2007 | Kalus et al. |
| 7,363,611 B2 | 4/2008 | Rosenbluth |
| 7,376,512 B2 | 5/2008 | Hirscher et al. |
| 7,384,710 B2 | 6/2008 | Ogawa et al. |
| 7,403,649 B2 | 7/2008 | Cai et al. |
| 7,441,227 B2 | 10/2008 | Abrams et al. |
| 7,480,889 B2 | 1/2009 | Abrams et al. |
| 7,483,559 B2 | 1/2009 | Luk-Pat et al. |
| 7,557,921 B1 | 7/2009 | Adel et al. |
| 7,565,001 B2 | 7/2009 | Cai et al. |
| 7,571,423 B2 | 8/2009 | Abrams et al. |
| 7,617,474 B2 | 11/2009 | Pang et al. |
| 7,646,906 B2 | 1/2010 | Saidin et al. |
| 7,676,077 B2 | 3/2010 | Kulkarni et al. |
| 7,689,966 B2 | 3/2010 | Verma et al. |
| 7,695,876 B2 | 4/2010 | Ye et al. |
| 7,698,665 B2 | 4/2010 | Abrams et al. |
| 7,703,049 B2 | 4/2010 | Abrams et al. |
| 7,703,068 B2 | 4/2010 | Abrams et al. |
| 7,707,541 B2 | 4/2010 | Abrams et al. |
| 7,749,666 B2 | 7/2010 | Gassner et al. |
| 7,757,201 B2 | 7/2010 | Abrams et al. |
| 7,769,225 B2 | 8/2010 | Kekare et al. |
| 7,805,700 B2 | 9/2010 | Peng |
| 7,853,920 B2 | 12/2010 | Preil et al. |
| 7,921,383 B1 | 4/2011 | Wei |
| 7,984,391 B2 | 7/2011 | Abrams et al. |
| 7,992,109 B2 | 8/2011 | Abrams et al. |
| 7,995,832 B2 | 8/2011 | Xiong et al. |
| 8,056,021 B2 | 11/2011 | Abrams et al. |
| 8,057,967 B2 | 11/2011 | Ye et al. |
| 8,142,958 B2 | 3/2012 | Holfeld |
| 8,200,002 B2 | 6/2012 | Preil et al. |
| 8,204,295 B2 | 6/2012 | Preil et al. |
| 8,208,712 B2 | 6/2012 | Preil et al. |
| 8,260,032 B2 | 9/2012 | Preil et al. |
| 8,280,146 B2 | 10/2012 | Preil et al. |
| 8,285,030 B2 | 10/2012 | Zhou et al. |
| 8,331,645 B2 | 12/2012 | Preil et al. |
| 8,386,968 B2 | 2/2013 | Pang |
| 8,458,622 B2 | 6/2013 | Pang et al. |
| 8,463,016 B2 | 6/2013 | Pang |
| 8,555,214 B2 | 10/2013 | Clifford |
| 8,612,903 B2 | 12/2013 | Pang et al. |
| 8,644,588 B2 | 2/2014 | Preil et al. |
| 2002/0192578 A1 | 12/2002 | Tanaka et al. |
| 2003/0103189 A1 | 6/2003 | Neureuther et al. |
| 2003/0106642 A1 | 6/2003 | Fairbairn et al. |
| 2004/0008880 A1 | 1/2004 | Horie et al. |
| 2004/0265707 A1 | 12/2004 | Socha |
| 2005/0122500 A1 | 6/2005 | Ye et al. |
| 2005/0168498 A1 | 8/2005 | Granik |
| 2006/0048089 A1 | 3/2006 | Schwarzband |
| 2006/0051682 A1 | 3/2006 | Hess et al. |
| 2006/0062445 A1 | 3/2006 | Verma et al. |
| 2006/0273242 A1 | 12/2006 | Hunsche et al. |
| 2007/0105029 A1 | 5/2007 | Ausschnitt |
| 2007/0133862 A1 | 6/2007 | Gold et al. |
| 2007/0198963 A1 | 8/2007 | Granik et al. |
| 2008/0152212 A1 | 6/2008 | Feldman |
| 2008/0170774 A1 | 7/2008 | Xiong et al. |
| 2008/0198350 A1 | 8/2008 | Sugita et al. |
| 2008/0241708 A1 | 10/2008 | Lin et al. |
| 2010/0135568 A1 | 6/2010 | Preil |
| 2011/0022994 A1 | 1/2011 | Hu et al. |
| 2011/0194752 A1 | 8/2011 | Pang |
| 2011/0229805 A1 | 9/2011 | Wang et al. |
| 2012/0066651 A1 | 3/2012 | Pang et al. |
| 2012/0066652 A1 | 3/2012 | Clifford |
| 2012/0134542 A1 | 5/2012 | Pang et al. |
| 2012/0137260 A1 | 5/2012 | Pang |
| 2012/0189187 A9 | 7/2012 | Preil et al. |

FOREIGN PATENT DOCUMENTS

| | | |
|---|---|---|
| WO | WO 2005/078528 A2 | 8/2005 |
| WO | WO 2005/078528 A3 | 8/2005 |
| WO | WO 2008/039674 A2 | 4/2008 |
| WO | WO 2008/039674 A3 | 4/2008 |

OTHER PUBLICATIONS

Response to Written Opinion filed Jul. 17, 2008, in Luminescent Technologies, Inc. International Application No. PCT/US07/078913, "Photo-Mask and Wafer Image Reconstruction" filing date Sep. 19, 2007.

Abrams, D.S., et al., "Fast Inverse Lithography Technology," Proc. SPIE vol. 6154, Optical Microlithography XIX, Mar. 15, 2006, pp.

Chen, C.Y. et al, "Mask defect auto disposition based on aerial image in mask product", Proc. SPIE 7379, 73791F (2009).

Granik, Y., "Solving Inverse Problems of Optical Microlithography," Proc. SPIE vol. 5754, Optical Microlithography XVIII, May 12, 2005, pp. 506-526.

Khan, M. et al., "A Semi-Empirical Resist Dissolution Model for Sub-micron Lithographies", pp. 41-46, by Technical Proceedings of the 1998 International Conference on Modeling and Simulation of Microsystems, 1998.

Pang, L., et al. "Full Chip Scale Source Mask Optimization (SMO) Implemented through Level Set Methods based Inverse Lithography Technology (ILT) Framework," Luminescent Litho Workshop 2009 Abstract, Apr. 29, 2009 vJM1.

Pang et al., "Considering MEEF in Inverse Lithography Technology (ILT) and Source Mask Optimization (SMO)" SPIE, vol. 7122, 14 pgs., (Oct. 17, 2008).

Pang, L. et al., "Computational Lithogaphy & Inspection (CLI) and its Applications in Mask Inspection, Metrology, Review, and Repair," Luminescent Technologies Inc., Palo Alto, CA, Sep. 28, 2010.

Rosenbluth et al., "Optimum Mask and Source Patterns to Print Given Shape", Apr. 2002, SPIE Proceedings vol. 4346, pp. 13-30.

Sethian, J.A. and Adalsteinsson, D., "An overview of level set methods for etching, deposition, and lithography development", IEEE Trans. on Semiconductor Manufacturing, vol. 10, No. 1, pp. 1-30, Jan. 8, 1996.

Xiao et al., "Source Optimization and Mask Design to Minimize MEEF in Low $k_1$ Lithography" SPIE, vol. 7028, 11 pgs., (Jun. 9, 2008).

```
                                                                    ┌─ 100
┌─────────────────────────────────────────────────────────────┐
│  MEASURE A FIRST IMAGE OF A FIRST SUBSTRATE AND A SECOND IMAGE OF │
│     A BLANK THAT INCLUDES MULTIPLE LAYERS DEPOSITED ON THE   │
│                          SUBSTRATE                            │
│                             110                               │
└─────────────────────────────────────────────────────────────┘
                                 │
                                 ▼
┌─────────────────────────────────────────────────────────────┐
│   IDENTIFY FIRST POTENTIAL DEFECTS IN THE SUBSTRATE AND/OR THE │
│  MULTIPLE LAYERS BASED ON THE FIRST IMAGE AND THE SECOND IMAGE │
│                             112                               │
└─────────────────────────────────────────────────────────────┘
                                 │
                                 ▼
┌─────────────────────────────────────────────────────────────┐
│  MEASURE A THIRD IMAGE OF AN EUV PHOTO-MASK THAT INCLUDES A MASK │
│           PATTERN DEFINED IN AN ABSORPTION LAYER               │
│                             114                               │
└─────────────────────────────────────────────────────────────┘
                                 │
                                 ▼
┌─────────────────────────────────────────────────────────────┐
│   IDENTIFY SECOND POTENTIAL DEFECTS IN THE EUV PHOTO-MASK BASED │
│       ON THE SECOND IMAGE AND THE FIRST POTENTIAL DEFECTS      │
│                             116                               │
└─────────────────────────────────────────────────────────────┘
                                 │
                                 ▼
┌─────────────────────────────────────────────────────────────┐
│  DETERMINE A QUALIFICATION CONDITION OF THE EUV PHOTO-MASK BASED │
│  ON THE FIRST POTENTIAL DEFECTS AND THE SECOND POTENTIAL DEFECTS │
│                             118                               │
└─────────────────────────────────────────────────────────────┘
                                 │
                                 ▼
┌─────────────────────────────────────────────────────────────┐
│   DETERMINE A MODIFICATION TO THE EUV PHOTO-MASK BASED ON THE │
│    FIRST POTENTIAL DEFECTS AND THE SECOND POTENTIAL DEFECTS   │
│                          (OPTIONAL)                           │
│                             120                               │
└─────────────────────────────────────────────────────────────┘
```

FIG. 1

MULTISTAGE EXTREME ULTRA-VIOLET MASK QUALIFICATION

BACKGROUND OF THE INVENTION

1. Field of the Invention

The present invention relates to techniques for inspecting, qualifying and repairing a photo-mask for use in photolithography at extreme ultra-violet wavelengths.

2. Related Art

Photolithography is a widely used technology for producing integrated circuits. In this technique, a light source illuminates a photo-mask. The resulting spatially varying light pattern is projected onto a photoresist layer on a semiconductor wafer by an optical system (which is referred to as an 'exposure tool'). By developing the 3-dimensional (3D) pattern produced in this photoresist layer (which is sometimes referred to as a 'target pattern'), a layer in the integrated circuit is created. Furthermore, because there are often multiple layers in a typical integrated circuit, these operations may be repeated using several photo-masks to produce a product wafer.

In order to appropriately scale to smaller critical dimensions in integrated circuits (and, thus, to reduce diffraction and proximity effects that occur when light is propagated through the optics of the exposure tool and is converted into the 3D pattern in the photoresist), commensurately smaller wavelengths of light may be provided by the light source. However, it is difficult to design and manufacture transmission photo-masks at small wavelengths, such as in the extreme ultra-violet (EUV).

Recently, reflective or EUV photo-masks have been investigated for use with wavelengths in the extreme ultra-violet. In an EUV photo-mask, a multilayer stack is used to reflect the light from the light source. For example, multiple alternating layers of silicon and molybdenum may be deposited on silicon or a glass substrate having an ultra-low thermal expansion coefficient (such as quartz). Then, the mask pattern may be defined in an absorption layer (such as tantalum nitride) that is deposited on top of the multilayer stack.

In practical reflecting photo-masks, up to 80 alternating layers are used. Furthermore, these layers may have thicknesses as small as 2-4 nm. However, this structure can be difficult to manufacture. For example, during the manufacturing process defects can occur throughout the multilayer stack. It can be difficult to detect the presence of a defect in the multilayer stack without performing destructive analysis. In addition, even if a defect is detected (or when a type of defect is probable in a given manufacturing process), it is often difficult (or impossible) to predict the consequences of the defect in the photolithographic process (e.g., will the defect result in an unacceptable change in the 3D pattern) or to determine how to modify an EUV photo-mask to reduce or eliminate the effect of a defect on the photolithographic process. As a consequence, the inspection and qualification criteria for EUV photo-masks are often needlessly conservative, which results in rejection of EUV photo-masks that could be successfully used in the photolithographic process (i.e., the EUV photo-mask yield may be needlessly reduced), thereby significantly increasing the cost of EUV photo-masks. In addition, it is often difficult to appropriately modify the photo-mask to reduce or eliminate the effect of the defect on the photolithographic process, which also adversely impacts the EUV photo-mask yield, and this also increases the cost of EUV photo-masks.

Hence, what is needed is an EUV photo-mask inspection and qualification technique that overcomes the problems listed above.

SUMMARY OF THE INVENTION

The present disclosure relates to a computer system for determining a qualification condition of an extreme ultra-violet (EUV) photo-mask. During operation, the computer system measures a first image of a substrate and a second image of a blank that includes multiple layers deposited on the substrate. Then, the computer system identifies first potential defects on the substrate and/or in the multiple layers based on the first image and the second image. Moreover, the computer system measures a third image of the EUV photo-mask that includes a mask pattern defined in an absorption layer, which is deposited on top of the multiple layers, wherein measurement of the third image uses information associated with the first potential defects. Next, the computer system identifies second potential defects in the EUV photo-mask based on the third image and the first potential defects. Based on the first potential defects and the second potential defects, the computer system determines the qualification condition of the EUV photo-mask.

Note that the second image may include: multiple optical microscope images that are obtained using different focal lengths or light polarizations; multiple confocal microscope images; an aerial image associated with the blank; and/or an image of a test-wafer pattern produced using the blank.

In some embodiments, identifying the first potential defects involves a first inverse optical calculation based on the first image and a second inverse optical calculation based on the second image, where the first image is at an image plane of a first model of a first optical system in the first inverse optical calculation and the second image is at the image plane of a second model of a second optical system in the second inverse optical calculation. The first model of the optical system may correspond to a first measurement system that measured the first image, and the second model of the optical system may correspond to a second measurement system that measured the second image. Furthermore, measurement of the third image may involve alignment with the first image and the second image based on the information associated with the first potential defects, where the information may include masking of at least some of the first potential defects in the third image by the absorption layer. For example, the information may include locations of the first potential defects.

Additionally, qualifying the EUV photo-mask may involve a forward optical calculation to assess printability of the first potential defects and the second potential defects on a semiconductor wafer at an image plane of a model of an optical system associated with a photo-lithographic process.

In some embodiments, the computer system determines a modification to the EUV photo-mask based on the first potential defects and the second potential defects. This modification may involve a change in the mask pattern. For example, the modification may involve an additive process and/or a subtractive process.

Another embodiment provides a method including at least some of the above-described operations.

Another embodiment provides a computer-program product for use in conjunction with the computer system.

INCORPORATION BY REFERENCE

All publications, patents, and patent applications mentioned in this specification are herein incorporated by reference to the same extent as if each individual publication, patent, or patent application was specifically and individually indicated to be incorporated by reference.

BRIEF DESCRIPTION OF THE DRAWINGS

The novel features of the invention are set forth with particularity in the appended claims. A better understanding of the features and advantages of the present invention will be obtained by reference to the following detailed description that sets forth illustrative embodiments, in which the principles of the invention are utilized, and the accompanying drawings of which:

FIG. 1 is a flow chart illustrating a method for determining a qualification condition of an extreme ultra-violet (EUV) photo-mask in accordance with an embodiment of the present invention.

Note that like reference numerals refer to corresponding parts throughout the drawings. Moreover, multiple instances of the same part are designated by a common prefix separated from an instance number by a dash.

DETAILED DESCRIPTION OF THE INVENTION

Figure 2:
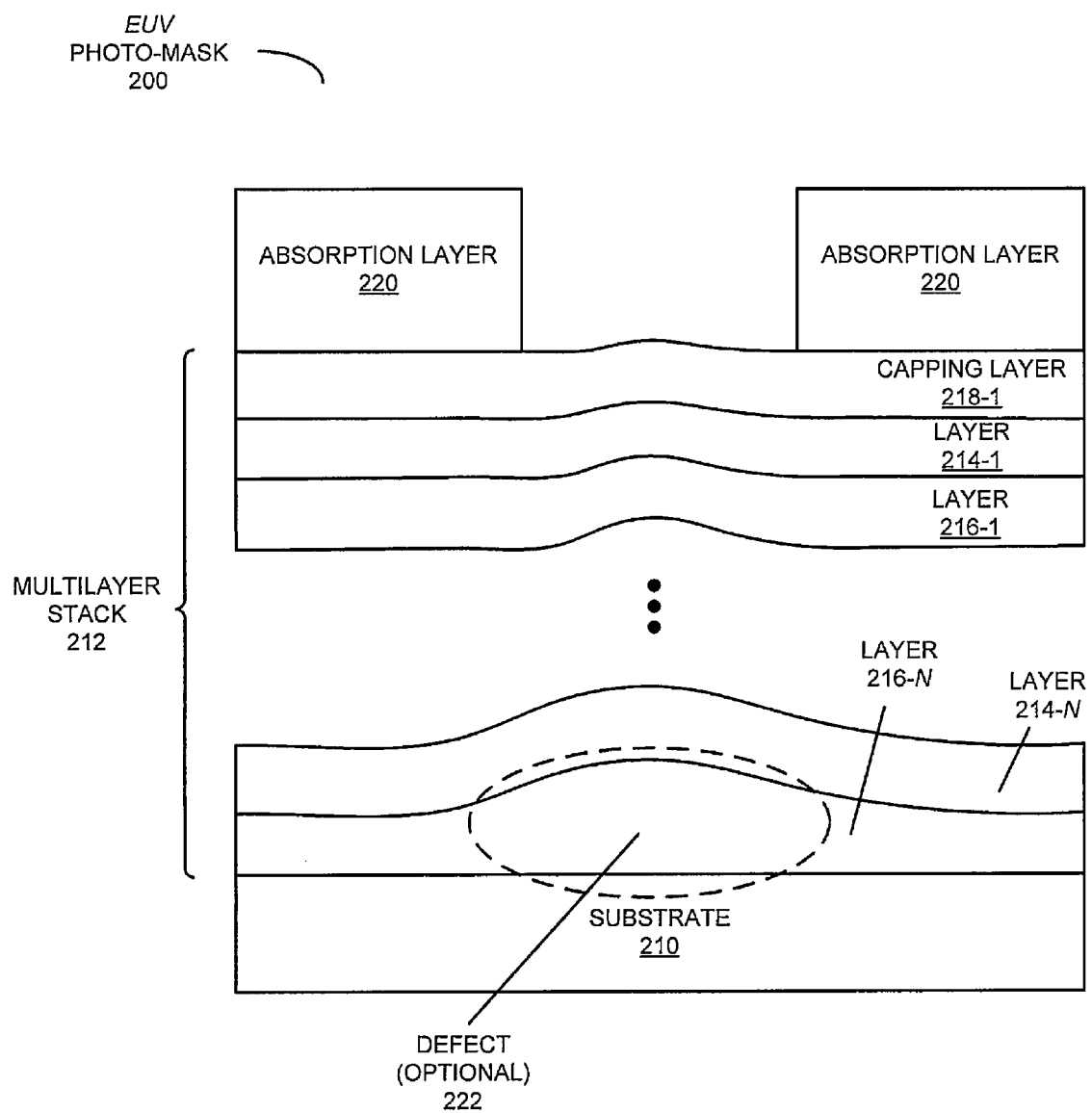
FIG. 2 is a drawing illustrating a side view of a multilayer stack in an EUV photo-mask in accordance with an embodiment of the present invention.

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Embodiments of a computer system, a method, and a computer program product (i.e., software) for use with the computer system are described. These systems and processes may be used to inspect, qualify and repair photo-masks for use at extreme ultra-violet (EUV) wavelengths, such as wavelengths between 10-124 nm. By measuring comparing images of a substrate and a blank that includes multiple layers deposited on the substrate, the computer system identifies first potential defects on the substrate and/or in the multiple layers. Then, the computer system measures a third image of the EUV photo-mask that includes a mask pattern defined in an absorption layer, which is deposited on top of the multiple layers. This measurement of the third image uses information associated with the first potential defects, such as locations of the first potential defects. Based on the third image and the first potential defects, the computer system identifies second potential defects in the EUV photo-mask. Next, the computer system determines a qualification condition of the EUV photo-mask based on the first potential defects and the second potential defects.

In the discussion that follows, a reflective photo-mask (which is sometimes referred to as an 'EUV photo-mask') should be understood to include an absorption layer, an alternating phase-shift layer, and/or an attenuating phase-shift layer deposited on a multilayer stack, which in turn is deposited on a substrate. This reflective photo-mask may be used in extreme ultra-violet photolithography. Furthermore, the reflective photo-mask may be used in multiple-exposure photolithography, where patterns printed on a wafer or semiconductor die using two or more reflective photo-masks are combined to produce a desired or target pattern, such as a portion of an integrated circuit. Furthermore, a mask pattern should be understood to include the pattern of spatially varying transmittance magnitude and/or transmittance phase of the absorption layer, the alternating phase-shift layer, and/or the attenuating phase-shift layer deposited on the multilayer stack. Note that, typically, the manufactured or fabricated mask pattern in a given reflective photo-mask may deviate from an ideal target mask pattern, for example, because of defects that can occur during the photo-mask fabrication process. In addition, as described further below, there may be defects in the multilayer stack.

In addition, in the discussion that follows note that a mask pattern or a target pattern may include a bitmap or grayscale file that includes a set of values corresponding to pixels in the mask pattern or the target pattern. Furthermore, the quantization (i.e., the number of bits) in these files may be varied, as needed, during the calculations that are described. Alternative formats having the same or similar information content, including a vector-based format such as a Graphic Design System II (GDSII) and/or an OASIS format, may be used in some embodiments of the mask pattern or the target pattern. In some embodiments, the mask pattern or the target pattern include real and imaginary components (or equivalently, magnitude and phase information).

We now describe embodiments of a computer system, a method, and software for determining a qualification condition of an extreme ultra-violet (EUV) photo-mask. FIG. 1 presents a flow chart illustrating a method 100 for determining a qualification condition of an extreme ultra-violet (EUV) photo-mask, which may be performed by a computer system (such as computer system 1100 in FIG. 11). During operation, the computer system measures a first image of a substrate and a second image of a blank that includes multiple layers deposited on (or disposed on) the substrate (operation 110). Note that the first image may include: an aerial image of the substrate, a confocal microscope image of the substrate, a dark-field optical image, and/or an image of a test wafer pattern produced using the substrate. Moreover, the second image may include: multiple optical microscope images that are obtained using different focal lengths or light polarizations; multiple confocal microscope images; an aerial image associated with the blank; and/or an image of a test wafer pattern produced using the blank.

Then, the computer system identifies first potential defects on the substrate and/or in the multiple layers based on the first image and the second image (operation 112). In some embodiments, identifying the first potential defects involves a first inverse optical calculation based on the first image and a second inverse optical calculation based on the second image, where the first image is at an image plane of a first model of a first optical system in the first inverse optical calculation and the second image is at the image plane of a second model of a second optical system in the second inverse optical calculation. The first model of the optical system may correspond to a first measurement system that measured the first image, and the second model of the optical system may correspond to a second measurement system that measured the second image. (Thus, the same or different optical systems may be used to measure the first image and the second image. Therefore, the same or different models of the optical systems may be used in the first inverse optical calculation and the second inverse optical calculation.) Inverse optical calculations are described further below with reference to FIG. 10.

Moreover, the computer system measures a third image of the EUV photo-mask that includes a mask pattern defined in an absorption layer (operation 114), which is deposited on top of the multiple layers, wherein measurement of the third image uses information associated with the first potential defects. Furthermore, measurement of the third image may involve alignment with the first image and the second image based on the information associated with the first potential defects, where the information may include masking of at least some of the first potential defects in the third image by the absorption layer. For example, the information may include locations of the first potential defects.

Next, the computer system identifies second potential defects in the EUV photo-mask based on the third image and the first potential defects (operation 116). Based on the first potential defects and the second potential defects, the computer system determines the qualification condition of the EUV photo-mask (operation 118). Note that qualifying the EUV photo-mask may involve a forward optical calculation to assess printability of the first potential defects and the second potential defects on a semiconductor wafer at an image plane of a model of an optical system associated with a photo-lithographic process. For example, a resist pattern on a wafer fabricated in a photo-lithographic process that uses the EUV photo-mask may be estimated. Forward optical calculations are described further below with reference to FIG. 9.

In some embodiments, the computer system optionally determines a modification to the EUV photo-mask based on the first potential defects and the second potential defects (operation 120). This modification may involve a change in the mask pattern. For example, the modification may involve an additive process (such as depositing another layer or an additional material on the photo-mask) and/or a subtractive process (such as etching). More generally, after determining the qualification condition (operation 118), the computer system may optionally provide a remedial action based on the determined qualification condition. For example, the computer system may provide instructions or suggestions as to how to repair or rework the EUV photo-mask. In an exemplary embodiment, the mask pattern may be modified or another may be added so that the deviations in the critical dimension of the estimated resist pattern on the wafer fabricated using the EUV photo-mask are less than 10% relative to the critical dimension of a target pattern.

In some embodiments of method 100 there are additional or fewer operations, the order of the operations is changed, and two or more operations are combined into a single operation. For example, the second image may include multiple images that are obtained at different focal lengths and/or different polarizations. Moreover, the first image, the second image and/or the third image may be aligned during method 100 using fiducial markers on the substrate, the multilayer stack and/or an absorption layer of the EUV photo-mask. Furthermore, instead of measuring the first image, the second image and/or the third image, the computer system may receive one or more of these images from a separate source, such as a separate measurement device or system, or a third party that performs the measurements on the EUV photo-mask.

In general, the accuracy of identifying the first potential defects may be improved by using the first image and the second image. However, in some embodiments, if the first image is unavailable, the second image is used to identify the first potential defects.

By performing this multi-stage inspection and qualification technique, defects in the EUV photo-mask can be identified and the performance of the EUV photo-mask may be appropriately assessed to determine the qualification condition.

FIG. 2 presents a drawing illustrating a side view of a multilayer stack 212 in a reflective (EUV) photo-mask 200. In particular, multilayer stack 212 may be deposited on a substrate 210 (such as silicon or quartz). Note that multilayer stack 212 includes alternating layers 214 and 216. For example, these layers may, respectively, include silicon and molybdenum, and may, respectively, have thicknesses of 4 nm and 2 nm. In some embodiments, there are 40 instances of alternating layers 214 and 216 (or 80 layers in total). In this example, the number of alternating layers 214 and 216, and their nominal (target) thicknesses, may specify the geometry of multilayer stack 212.

Furthermore, a capping layer 218 (such as ruthenium) may be deposited onto multilayer stack 212. Additionally, an absorption layer 220 (such as tantalum nitride) may be deposited on top of capping layer 218, and this absorption layer 220 may be patterned (for example, using electron-beam lithography) to define the two-dimensional mask pattern.

Multilayer stack 212 may include an optional defect 222, such as one associated with a fabrication process. For example, the EUV photo-mask may be fabricated using a sputtering process, and a buried defect, such as a 'bump' or a change in vertical position, may occur between substrate 210 and multilayer stack 212 and/or between layers in multilayer stack 212. In some embodiments, optional defect 222 has a height of 15 nm, which results in a 1.5 nm vertical deviation or displacement at a surface of multilayer stack 212. In other embodiments, optional defect 222 has a height between 2-5 nm and a width of 50 nm. More generally, optional defect 222 may include a deviation in a magnitude and/or a phase of the reflectance of EUV photo-mask 200 from that associated with a EUV photo-mask that excludes the defect, and which has a target mask pattern defined on its top surface. Thus, optional defect 222 may include a hard defect (such as a sputtering-induced bump in at least some of the layers in multilayer stack 212), an error in the mask pattern, and/or a soft defect (such as dirt or contamination on the surface of EUV photo-mask 200).

Note that detecting the presence of optional defect 222 in EUV photo-mask 200 can be difficult, especially if optional defect 222 is below the top surface of EUV photo-mask 200. In particular, it may be difficult to visually inspect EUV photo-mask 200 because absorption layer 220 may dominate the signal of optional defect 222. The inspection challenges may be even worse with electron-beam images, because may not be possible to detect a phase defect.

In the present discussion, images of substrate 210, substrate 210 and multilayer stack 212, and substrate 210, multilayer stack 212 and absorption layer 220 (i.e., the complete EUV photo-mask 200) are compared to determine a qualification or acceptance condition of EUV photo-mask 200 and/or to guide repair or rework, such as changes to the mask pattern in absorption layer 220 or adding another material to the surface of EUV photo-mask 200 to compensate or correct for optional defect 222.

Figure 3:
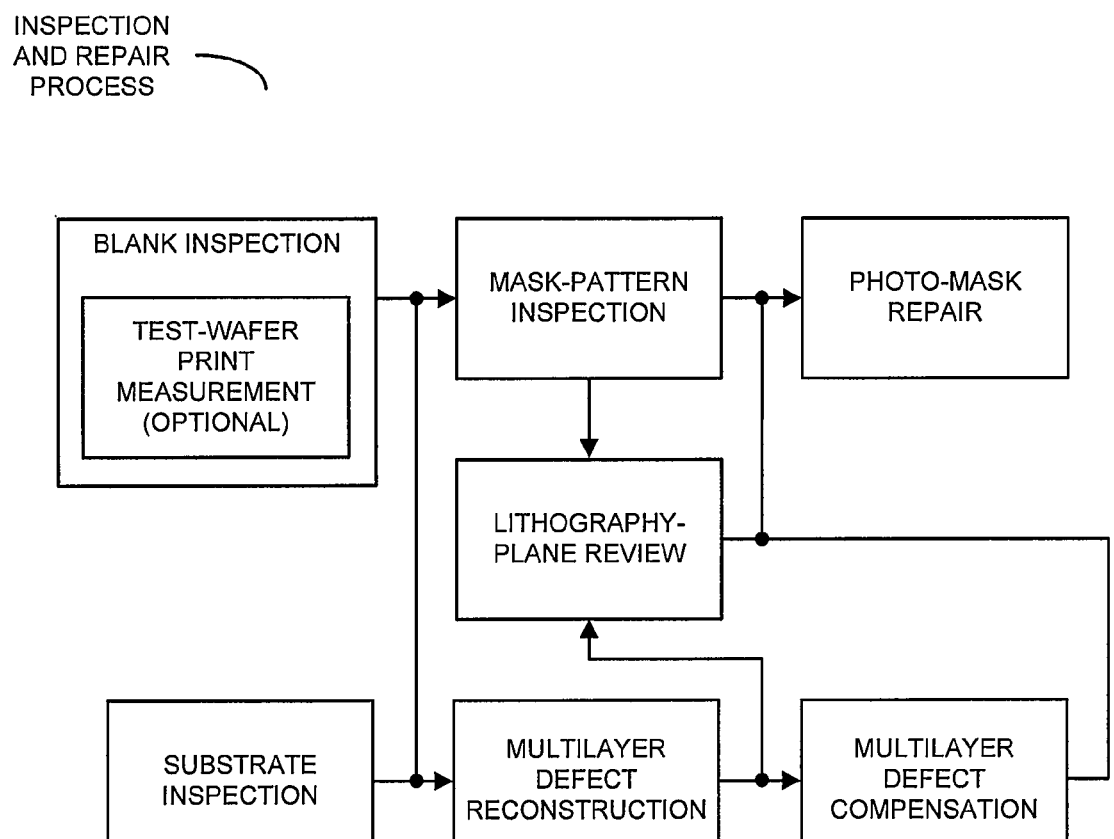
FIG. 3 is a drawing illustrating an inspection and repair process for an EUV photo-mask in accordance with an embodiment of the present invention.

We now describe an exemplary embodiment of the inspection and qualification technique. FIG. 3 presents a drawing illustrating an overview of an inspection and repair process for an EUV photo-mask. During this process, images of the substrate and the blank may be acquired or measured in the blank-inspection operation and the substrate-inspection operation. For example, the images may include: one or more confocal-microscope image(s) of a blank, aerial image of a substrate, an optional test-wafer print using the blank, etc. These images may be acquired on the substrate and the blank before or during fabrication of the EUV photo-mask. As described below with reference to FIG. 4, using these images one or more first potential defects may be identified after a 3-dimensional inverse optical calculation (which is sometimes referred to as 'multi-layer defect reconstruction').

Then, one or more images of the mask pattern of the EUV photo-mask may be acquired or measured during the mask-pattern-inspection operation and, as described below with reference to FIG. 5, second potential defects may be identified. Note that these images of the mask pattern may be at locations associated with the one or more first potential defects. As described below with reference to FIG. 6, note that identification of these locations may be facilitated by aligning the images of the substrate and the blank with the one or more images of the mask pattern. For example, the one or more first potential defects may be used a fingerprints for purposes of alignment (which is sometimes referred to as 'coordinate constrained multi-image matching').

Moreover, as described below with reference to FIGS. 7 and 8, during lithography-plane review a forward optical calculation may be used to determine the impact of the one or more first potential defects and any second potential defects identified in the one or more images of the mask pattern. For example, the 'printability' at a wafer in a photo-lithographic process that includes the EUV photo-mask may be estimated to determine the impact of the first and second potential defects.

The results of the mask-pattern-inspection and the lithography-plane review, such as the one or more first potential defects and/or the one or more second potential defects may be used during a photo-mask-repair operation. In addition, the results of the multi-layer defect reconstruction and/or the lithography-plane review may be used in multi-layer defect compensation, which may determine modifications to the mask pattern to correct or compensate for the one or more first potential defects and/or the one or more second potential defects. The computed modification(s) may be used during repair of the EUV photo-mask. For example, the thickness of the absorption layer may be changed and/or a two-dimensional pattern of the absorption layer may be modified.

Note that the forward optical calculation and/or the inverse optical calculation may involve a fast EUV simulation. In particular, during the fast EUV simulation a computer system (such as computer system 1100 in FIG. 11) may determine contributions to reflected light from multiple discrete cells in a model of the multilayer stack in the EUV photo-mask based on angles of incidence of light in a light pattern to the multilayer stack, a polarization of the light in the light pattern, and a varying intensity of the light in the light pattern through the multilayer stack, where the multiple discrete cells are at horizontal and vertical positions in the multilayer stack, and where the multilayer stack includes at least one defect. Then, the computer system may adjust phase values of the contributions to the reflected light from the multiple discrete cells, thereby specifying optical path differences between the multiple discrete cells in the multilayer stack that are associated with one or more defects, such as the first potential defects. Moreover, the computer system may combine the contributions to the reflected light from multiple discrete cells to determine the reflected light from the multilayer stack. Next, the computer system may selectively shift k-space representations of the contributions to the reflected light from the multiple discrete cells based on the angles of incidence, thereby accounting for phase variations associated with deviations from normal incidence. This approach to handling the variations in the normal orientation may result in a reasonable tradeoff between the speed and the accuracy of the fast EUV simulation (for example, the fast EUV simulation may be four to five-times faster than existing reflected-light calculation techniques, and the accuracy may be 4% for incident light having an angle of incidence up to 9°).

The horizontal and vertical positions may be included in horizontal planes (e.g., x,y planes) in the multilayer stack that are separated by a spacing or a height z. In these embodiments, deviations in vertical positions within the multilayer stack that are associated with the defect(s) may be addressed using the phase values. Furthermore, determining the reflected light from a given discrete cell in the multiple discrete cells may use a closed-form expression for the reflected light. For example, the closed-form expression may treat the given discrete cell as an infinite two-dimensional sheet in the multilayer stack.

Additionally, for a given discrete cell, the varying intensity of the light pattern through the multilayer stack may involve calculating cumulative reflection and absorption by intervening discrete cells between the given discrete cell and a top surface of the multilayer stack.

In some embodiments, prior to determining the contributions to the reflected light from the multiple discrete cells, the computer system may optionally calculate absorption of incident light to the EUV photo-mask by an absorption layer in the model, which is deposited on the multilayer stack in the EUV photo-mask, thereby determining the light pattern incident to the multilayer stack, where the absorption layer includes a mask pattern of the EUV photo-mask. Note that the incident light may be represented by a plane wave and/or the light pattern may include a near-field diffraction pattern associated with the mask pattern. Furthermore, after combining the contributions to the reflected light from multiple discrete cells, the computer system may optionally calculate absorption of the reflected light from the EUV photo-mask by the absorption layer, thereby calculating reflected light from the EUV photo-mask.

Figure 4:
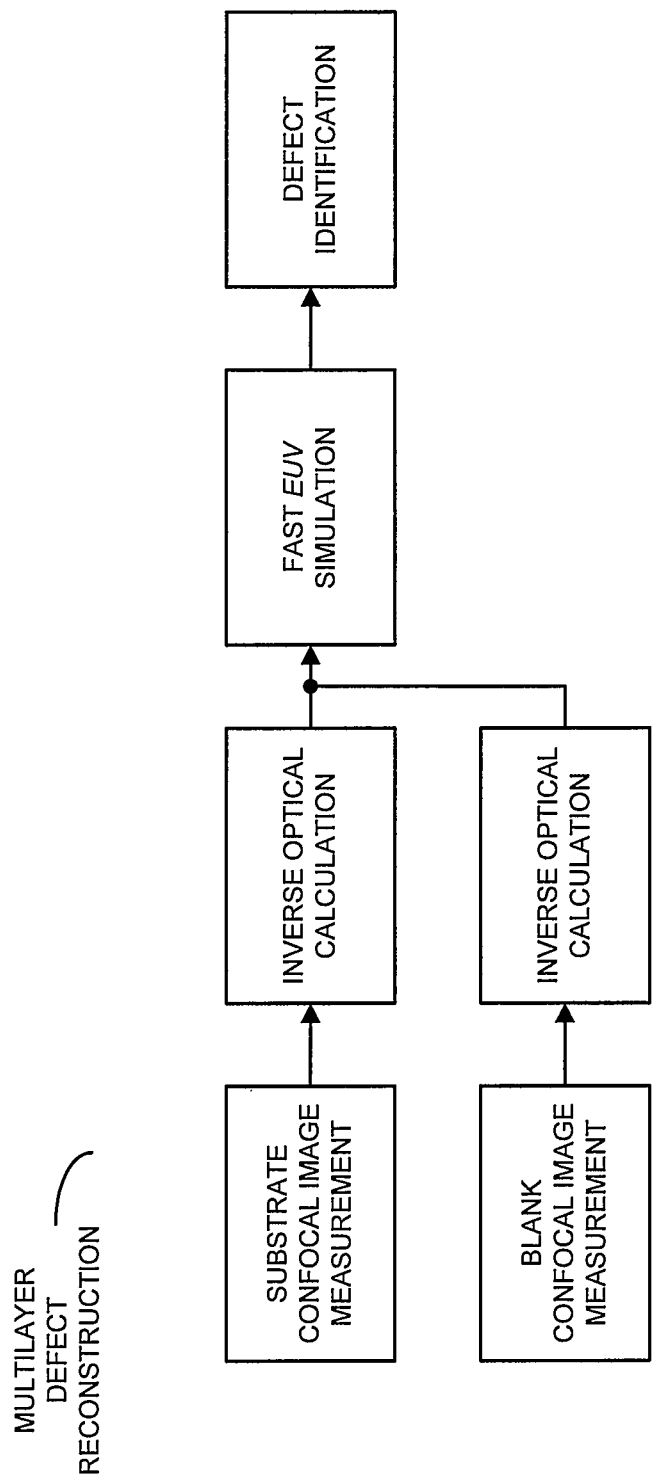
FIG. 4 is a drawing illustrating multilayer defect reconstruction during the inspection and repair process in FIG. 3 in accordance with an embodiment of the present invention.

FIG. 4 presents a drawing illustrating the multi-layer defect reconstruction during the inspection and repair process in FIG. 3. In this example, confocal-microscope images of the substrate and the blank (having a mechanical alignment of 1

µm) are used in an inverse 3D optical calculation to recover one or more 3D profiles in the EUV photo-mask (such as of a top surface of the substrate and a top surface of the blank) based on a model of an optical path in a confocal microscope. For example, the optical path may be modeled as a low-pass filter, and out-of-focus images of defects deep in the EUV photo-mask may be restored to in-focus images of the defects using the inverse 3D optical calculation. These recovered 3D profiles may be used in the fast EUV simulation of the EUV photo-mask to identify the one or more first potential defects. In particular, the one or more first potential defects may be identified based on the recovered 3D profiles associated with the EUV photo-mask and specified 3D profiles for the substrate and/or the multilayer stack.

As noted previously, the images of the substrate and the blank, as well as information about the first potential defects, may be used during the mask-inspection process. This is shown in FIG. 5, which presents a drawing illustrating the mask-pattern inspection during the inspection and repair process in FIG. 3. In particular, a calculated 3D profile associated with a target mask pattern from a mask-pattern database and the recovered 3D profiles (after an inverse optical calculation) may be used to simulate the one or more images of the mask pattern of the EUV photo-mask. This process may involve aligning the recovered 3D profiles (of the substrate and the blank) and the 3D profile associated with the target mask pattern using a variable x, y offset. Moreover, during multiple-image coordinate-constrained matching, the one or more simulated images of the mask pattern may be aligned and compared to the one or more measured images of the mask pattern to identify any phase defects (in the first potential defects) and/or any second potential defects.

Figure 5:
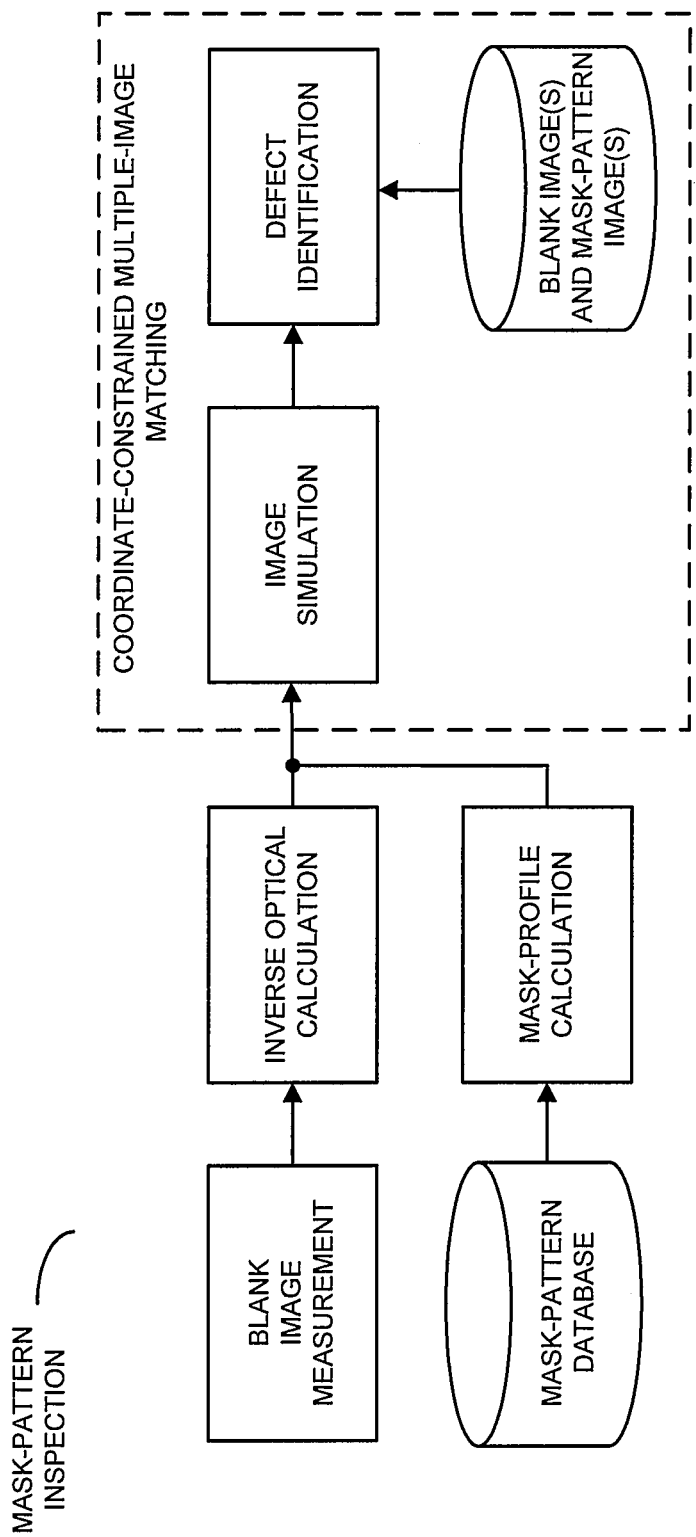
FIG. 5 is a drawing illustrating mask-pattern inspection during the inspection and repair process in FIG. 3 in accordance with an embodiment of the present invention.

As shown in FIG. 5, in the case of optical inspection of the mask pattern (such as deep ultra-violet optical inspection), the simulated one or more images of the mask pattern may be based on a forward-optical calculation and a model of the optical path in an optical inspection tool (for example, the optical path may be modeled as a low-pass filter). Alternatively, in the case of electron-beam inspection of the mask pattern, the simulated one or more images of the mask pattern may be based on a forward electro-optical calculation and a model of an electro-optical path transfer function of an electro-optical inspection tool (such as an electron microscope).

In an exemplary embodiment, the electro-optical path transfer function has an analytical derivative and/or is represented by a closed-form expression. In particular, the model of the electro-optical transfer function may correspond to: an electron-beam-size distribution $g_3$ (with a standard deviation of approximately 5-10 nm), a secondary-electron bulk-generation distribution $g_1$ (with a standard deviation of approximately 50 nm), a distribution associated with shadowing effects in the mask pattern $g_2$ (with a standard deviation of approximately 20 nm), a background electron-beam intensity b and a foreground electron-beam intensity f. Note that $g_1$ may determine how fast overshoot fades as the electron beam moves away from the mask-pattern edge, and $g_2$ may determine how fast shadowing fades as the electron beam moves away from a foothill.

In some embodiments, the model of the electro-optical transfer function corresponds to an overshoot amplitude $a_1$ (which is associated with enhanced secondary electron escape) and an undershoot amplitude $a_2$ (which is associated with blocking of secondary electron escape). Given a mask-pattern contour c, the model of the electro-optical transfer function may be represented as $$g_3 \otimes [a_1 \cdot c \cdot g_1 \otimes (1-c) + a_2 \cdot c \cdot (1-c) \cdot g_2 \otimes c + b \cdot c + f \cdot (1-c)],$$

where $\otimes$ is a convolution operation. Note that this model is, approximately, a derivative of a sin x function with low-pass filtering. In an exemplary embodiment, b equal to 101.606, f equals 123.742, $g_3$ equals 11.60326, $a_1$ equals 2.74477, $a_2$ equals 1.47, $g_1$ equals 12.52316, and $g_2$ equals 7.79846.

Figure 6:
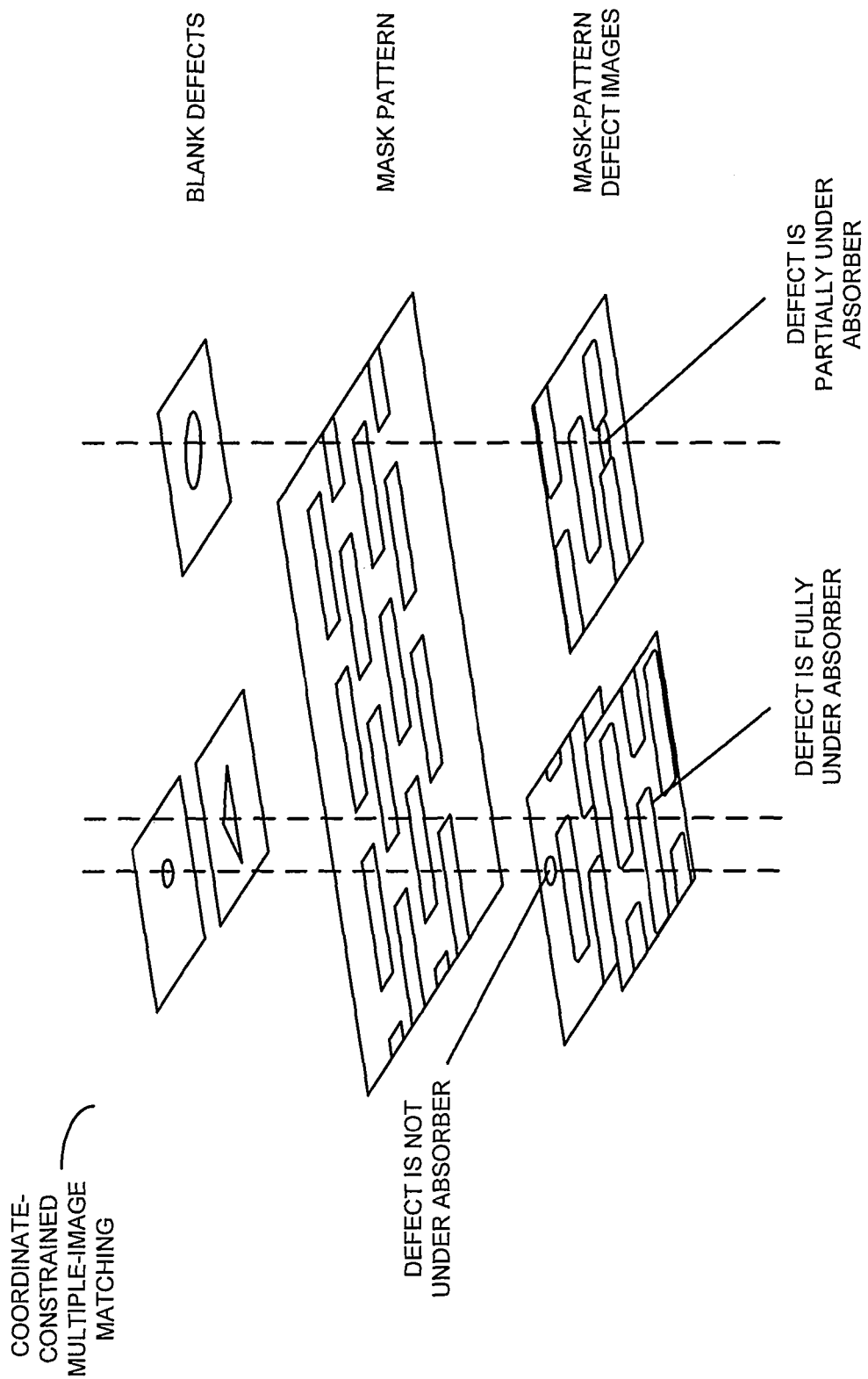
FIG. 6 is a drawing illustrating coordinate constrained multi-image matching during the inspection and repair process in FIG. 3 in accordance with an embodiment of the present invention.

As noted previously, potential defects in the EUV photo-mask (such as the first potential defects) may be used as fingerprints to facilitate alignment of the images during operations in the inspection and repair process in FIG. 3. This coordinate constrained multi-image matching is illustrated in FIG. 6. In particular, defects that are covered (or masked), defects that are not covered and/or defects that are only partially covered by the absorption layer can be used to align images.

Figure 7:
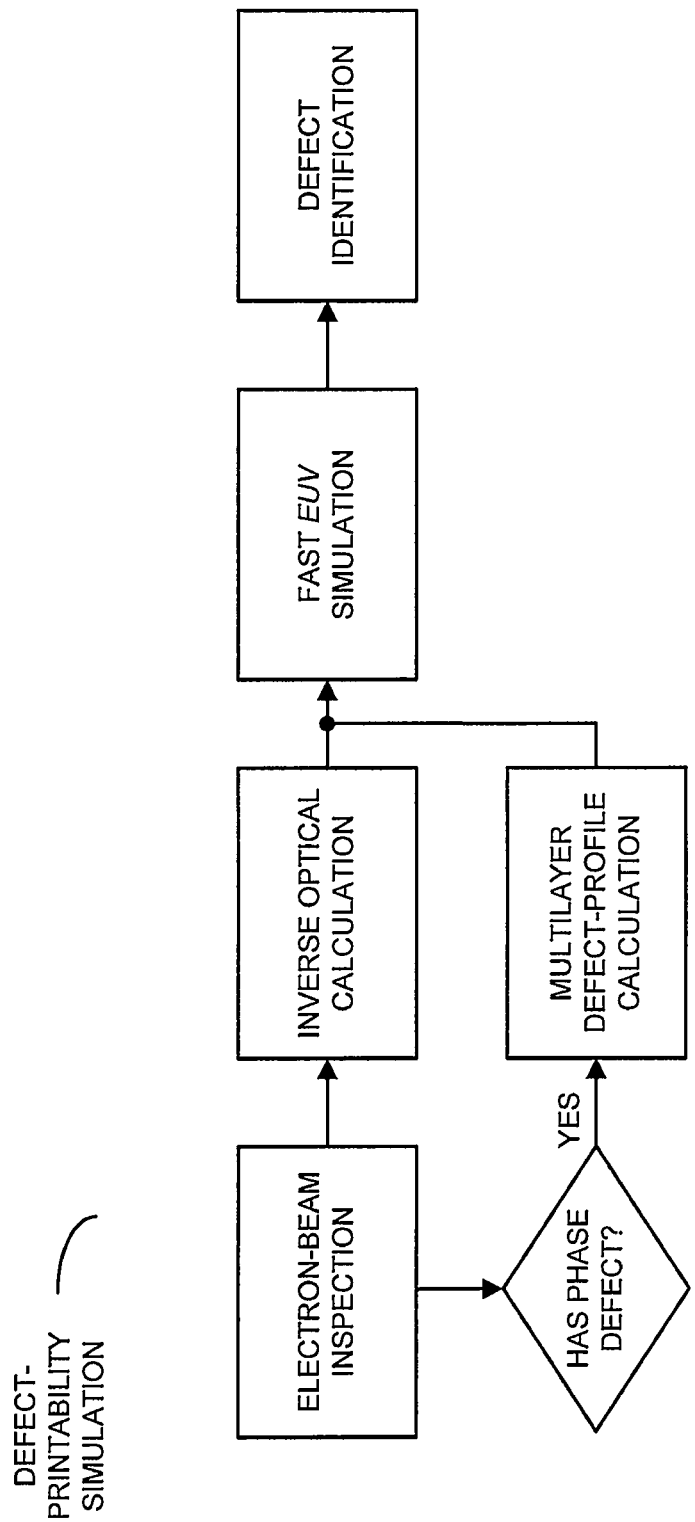
FIG. 7 is a drawing illustrating a defect-printing simulation during the inspection and repair process in FIG. 3 in accordance with an embodiment of the present invention.

As shown in FIG. 7, the impact of the identified defects may be assessed in the defect-printing simulation during the inspection and repair process in FIG. 3. In the case where the mask-pattern inspection involves electron-beam images, an inverse electro-optical calculation may be performed to de-noise the images and to recover the mask pattern (i.e., in the absorption layer) on the EUV photo-mask. This inverse optical calculation may use the model of the electro-optical transfer function described previously. Then, the fast EUV simulation may be used in a forward optical calculation to determine an aerial image or a simulated wafer pattern at an image plane in a photo-lithographic system, which may be compared to a target pattern (such as a layer in a circuit) or an estimated aerial image corresponding to the target pattern to determine the qualification condition of the EUV photo-mask. For example, a deviation in a critical dimension or in a process window may be determined and used to assess the qualification condition of the EUV photo-mask. In an exemplary embodiment, deviations of more than 10% may require remedial action or repair of the EUV photo-mask. Note that, if a phase error was identified in the first potential defects, the multilayer defect profile may be calculated and may also be used in the fast EUV simulation. Moreover, note that conditions associated with a photolithographic process in the forward optical calculation may include: immersion optics, a source pattern (for example, an annular, quadrupole, disk illumination with a sigma of 0.75, and/or a pixilated source pattern), a numerical aperture of 0.32 or 0.67, a wavelength of 13.5 nm, etc.

Figure 8:
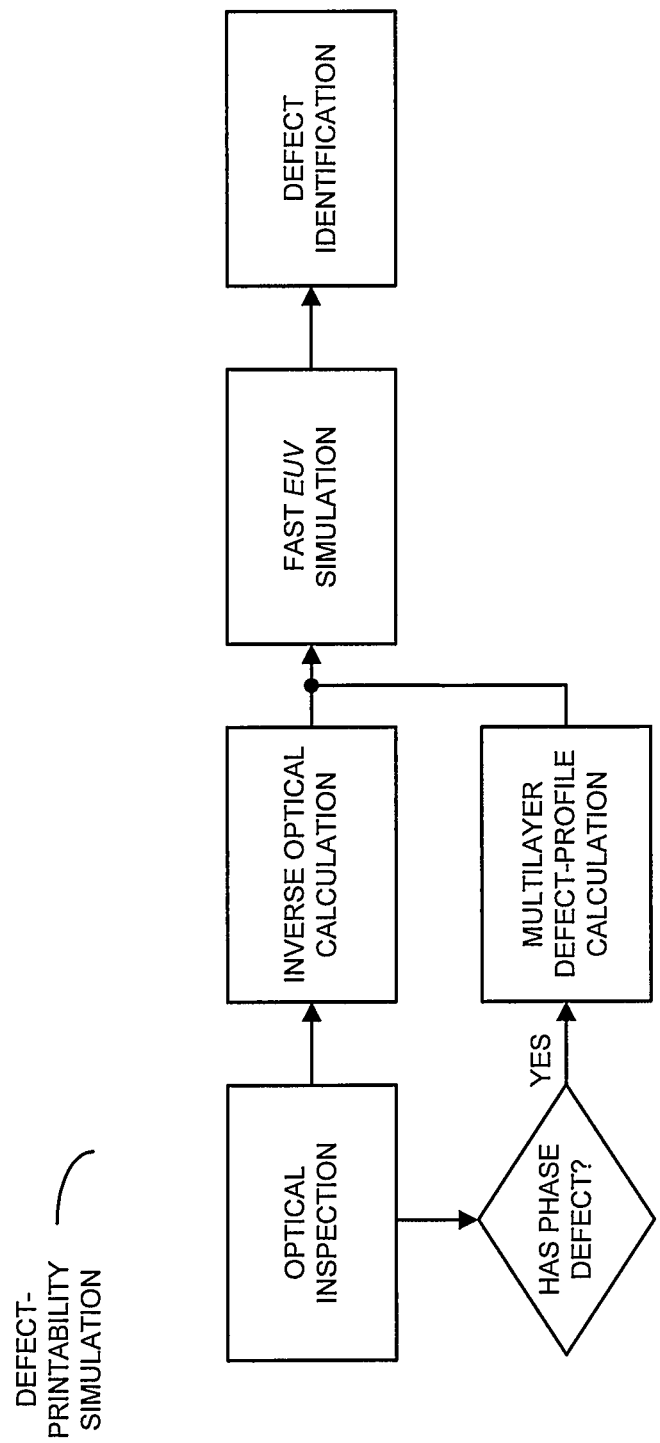
FIG. 8 is a drawing illustrating a defect-printing simulation during the inspection and repair process in FIG. 3 in accordance with an embodiment of the present invention.

Alternatively, as shown in FIG. 8, in the case where the mask-pattern inspection involves optical images, an inverse optical calculation may be performed to recover the mask pattern (i.e., in the absorption layer) on the EUV photo-mask.

Figure 9:
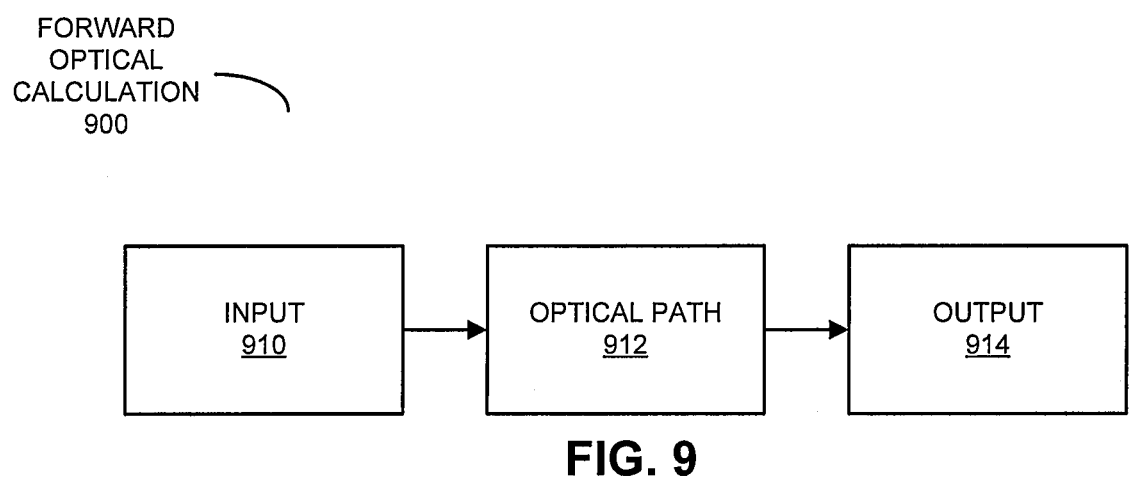
FIG. 9 is a block diagram illustrating a forward optical calculation in accordance with an embodiment of the present invention.

We now describe forward and inverse optical calculations. FIG. 9 presents a block diagram illustrating a forward optical calculation 900. In this calculation, reflected light (such as the reflected light provided by an EUV photo-mask when illuminated by a source pattern) is used as an input 910 to optical path 912 to determine a predicted output 914 (such as a pattern or an image) at an image plane of optical path 912 (or, in the case of a forward electro-optical calculation for an electron beam, a model of the electro-optical transfer function). For example, using the calculated reflected light from the EUV photo-mask (which is illuminated by a source pattern) and information about the optical path in an exposure tool, the aerial image can be determined.

Figure 10:
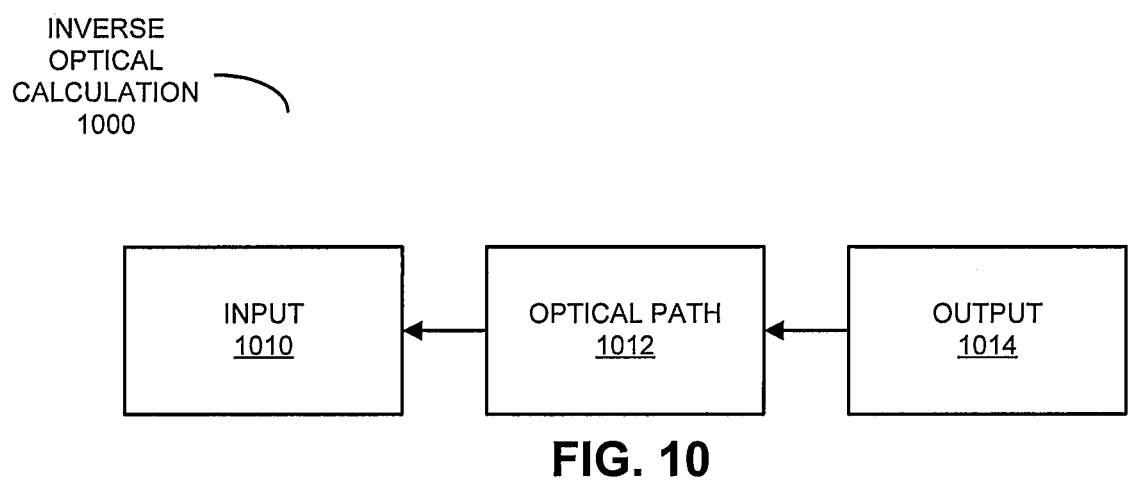
FIG. 10 is a block diagram illustrating an inverse optical calculation in accordance with an embodiment of the present invention.

FIG. 10 presents a block diagram illustrating an inverse optical calculation 1000. In this calculation, a predicted input 1010 (such as reflected light from a mask pattern of an EUV photo-mask) to optical path 1012 (or, in the case of an inverse electro-optical calculation for an electron beam, a model of the electro-optical transfer function) is determined based on an output 1014 (such as a pattern or an image). For example, the mask pattern at the object plane may be determined from the cost function at the image plane and information about the optical path in an exposure tool. In an exemplary embodiment, inverse optical calculation 1000 is used during multi-layer defect compensation to determine modifications to the mask pattern based on one or more defects that are identified in an EUV photo-mask.

While the preceding discussion illustrates the inverse optical calculation using a single output 1014, in other embodiments multiple patterns or images at image plane(s) of optical path 1012 may be used. For example, instead of a target or a calculated pattern, there may be a set of patterns that are each associated with different wavelengths, different focal conditions (e.g., on different focal surfaces or planes), and/or different imaging conditions in the measurement devices or the photo-lithographic system. These patterns may include magnitude and/or phase information. Furthermore, in some embodiments each of the patterns at the image plane(s) used in the inverse optical calculation 1000 or a term(s) including some combination of the patterns at the image plane(s) may be multiplied by a corresponding weight. In this way, inverse optical calculation 1000 may emphasize one or more of the patterns at the image plane relative to other patterns (at the same or other image planes) used in inverse optical calculation 1000.

In some embodiments, inverse optical calculation 1000 is based on iterative minimization of a cost function (H), which is also sometimes referred to as an 'error function' or a 'Hamiltonian function.' In particular, during each iteration of inverse optical calculation 1000 the cost function may be a function of the difference between output 1014 and a pattern (or image) that results when input 1010 is projected through optical path 1012. In some embodiments, input 1010 initially corresponds to the target mask pattern, and as the calculation progresses this pattern is allowed to evolve while output 1014 is held constant (subject to the constraints that there are a finite number of discrete steps sizes or pixel sizes).

In embodiments with multiple patterns (or images) at object plane(s) and/or image plane(s), the cost function (H) equals $$\sum_{j=1}^{N} w_j |I_j - I_{oj}|^n,$$

where $I_j$ is the forward projection of the jth mask pattern at the object plane (out of N patterns in this example) through optical path 1012, $w_j$ is a corresponding weight, $I_{oj}$ is the jth target image at an image plane, and n is a power. Note that the cost function (H) approaches zero as $I_j$ approaches $I_{oj}$.

In an exemplary embodiment, N is 3 and n is 2. Three patterns (or patterns) at the image plane(s) may be determined at three different focal conditions (or focus settings) in the measurement device or the photo-lithographic system. For example, with a wavelength of 260 nm, the focal conditions may be at −600 nm (relative to nominal focus), at 0 nm (i.e., at nominal focus), and 600 nm (relative to nominal focus). Alternatively or in addition, the three patterns (or images) at the image plane(s) may be determined at three different wavelengths or imaging conditions. Furthermore, a corresponding set of weights $\{w_1\}$ may be 1, 0.1, and 1.

In other embodiments, the weights are varied as inverse optical calculation 1000 progresses and/or different weights are used for specific parts (or even pixels) of a pattern. For example, the weights may be determined based on the difference between $I_j$ and $I_{oj}$ at a given step or iteration in inverse optical calculation 1000. This approach may exaggerate the features or defects, especially when inverse optical calculation 1000 is close to a local or global minimum and the cost function (H) corresponds to small differences. Thus, in general the cost function (H) may be expressed as a double integral over the pattern or image area and there may be separate time-dependent weights for $I_1$ and $I_{oj}$. Furthermore, in some embodiments the cost function (H) is expressed as a relative difference between $I_j$ and $I_{oj}$ for at least a portion of inverse optical calculation 1000 as it progresses.

It will be recognized by one of ordinary skill in the art that inverse optical calculation 1000 described above is poorly defined. In particular, numerous possible mask patterns at the object plane may result from the same observed output 1014. Therefore, input 1010 may be selected such that it is 'most likely' to represent the target mask pattern. A variety of constraints and additional criteria may be imposed when determining the solution(s) to this problem in order to find a unique answer(s). For example, input 1010 may be that which has the smallest value of the cost function (H).

Note that optical path 1012 may be different than optical path 912 (FIG. 9). In general, information about optical paths 912 (FIG. 9) and/or 1012 may include some or all of the aspects of the photolithographic process, such as: illumination settings, the electromagnetics of the EUV photo-mask, the measurement device or the exposure-tool optics, etc. In addition, in some embodiments forward optical calculation 900 (FIG. 9) and/or inverse optical calculation 1000 model the effect of a photoresist, including flare and/or etch effects.

The calculations corresponding to one or more optical paths in forward optical calculation 900 (FIG. 9) and/or inverse optical calculation 1000 may be implemented using Fourier-optical techniques. Furthermore, the optical path in forward optical calculation 900 (FIG. 9) and/or inverse optical calculation 1000 may include multiple models of optical paths (such as in a multiple-exposure photolithographic process). Also note that while optical path 912 (FIG. 9) and optical 1012 have, respectively, been traversed in a particular direction, these optical paths may be traversed in either direction.

Furthermore, note that forward optical calculation 900 (FIG. 9) and/or inverse optical calculation 1000 may take into account, by way of example but not limitation, various illumination conditions (e.g., off-axis, incoherent), the actual electromagnetics of the light field interacting with the EUV photo-mask, aberrations in optical paths 912 (FIG. 9) and/or 1012, and/or the vector nature of the electromagnetic field as it propagates through optical paths 912 (FIG. 9) and/or 1012. In some embodiments, aspects of forward optical calculation 900 in FIG. 9 (such as the mask pattern) and/or inverse optical calculation 1000 are represented using one or more level-set functions. Furthermore, in some embodiments, forward optical calculation 900 (FIG. 9) and/or inverse optical calculation 1000 are divided into a series of overlapping sub-problems (also referred to as 'work units'), at least some of which are processed independently and/or concurrently. These work units may be based on elements or structures (for example, repetitive structures) in the mask pattern and/or the target pattern (such as a layer in an integrated-circuit design). For example, the work units may be between 10,000 nm$^2$ and 100 µm$^2$ in size.

We now describe an exemplary embodiment of the forward optical calculation or forward projection operation used to calculate an aerial image and/or an estimated resist pattern. For simplicity, coherent illumination of the EUV or reflective photo-mask is utilized. Furthermore, the electric field falling upon the EUV photo-mask is approximately constant. Thus, the clear regions of the EUV photo-mask reflect the light, while the opaque regions absorb the light. It follows that a scalar electric field E illuminating the EUV photo-mask may be expressed as $$E(\vec{r}) = \begin{cases} 0 & \text{absorption} \\ 1 & \text{non-absorption} \end{cases},$$

where $\vec{r} = (x, y)$ is a point on the (x, y) plane. In some embodiments, this representation of the EUV photo-mask may be re-expressed using a function ϕ (referred to as a level-set function) having positive regions that indicate absorption regions and negative regions that indicate non-absorption regions. (More generally, the level-set function may represent the EUV photo-mask using two or more levels.) Furthermore, the level-set function may equal zero at the boundaries or contours of the EUV photo-mask. Therefore, the electric field E associated with the EUV photo-mask may be re-expressed as a function of this level-set function, i.e., $$E(\vec{r}) = \hat{h}(\phi(x,y)),$$

where $\hat{h}$ is the Heaviside function $$\hat{h}(x) = \begin{cases} 1 & x \geq 0 \\ 0 & x < 0 \end{cases}.$$

Since an ideal diffraction limited lens acts as a low-pass filter, this may be used as an approximation to the actual (almost but not quite perfect) optical component(s) in the optical path of an exposure tool (in this example). Mathematically, the action of the optical component(s) may be expressed as $$A(\vec{r}) = f^{-1}(\hat{C}(f(E(\vec{r})))) $$

where $A(\vec{r})$ indicates the electric field distribution on the wafer, f indicates the Fourier transform, $f^{-1}$ indicates the inverse Fourier transform, and $\hat{C}$ indicates the pupil cutoff function, which is zero for frequencies larger than a threshold determined by the numerical aperture of the optical component(s), and one otherwise. Thus, the pupil function is $$\hat{C}(k_x, k_y) = \hat{h}(k_{max}^2 - [k_x^2 + k_y^2]) = \begin{cases} 0 & k_x^2 + k_y^2 \geq k_{max}^2 \\ 1 & k_x^2 + k_y^2 < k_{max}^2 \end{cases},$$

wherein $k_x$, $k_y$, and $k_{max}$ represent frequency coordinates in Fourier space. Therefore, the aerial image (at the wafer in the exposure tool) is simply the square of the electric field $$I(\vec{r}) = |A(\vec{r})|^2.$$

Combining these two equations, we find $$F(\phi(x,y)) = (|f^{-1}(\hat{C}(f(\hat{h}(\phi(x,y)))))|^2).$$

This is a self-contained formula for the aerial image obtained by the exposure tool.

Note that this is just one embodiment of the forward projector that can be used within the scope of this disclosure, chosen by way of example due to its relative simplicity. More sophisticated forward models also fall within the scope of the present disclosure. Such models may take into account, by way of example but not limitation, various illumination conditions (e.g., off-axis, incoherent), the actual electromagnetics of the light field interacting with the EUV photo-mask, various types of EUV photo-masks, the polarization of the light field, the actual properties of the optical component(s) (such as aberrations), and/or the vector nature of the electromagnetic field as it propagates through the optical path.

In some embodiments, during each iteration of inverse optical calculation 1000 the level-set function corresponding to input 1010 being modified is updated according to $$\phi_{i+1} = \phi_i + \Delta t \cdot \nabla(H),$$

where $\phi_{i+1}$ is an updated version of the level-set function, $\phi_i$ is the current version of the level-set function, Δt is a step size in the calculation and ∇(H) is a gradient or a derivative of the cost function. In an exemplary embodiment, ∇(H) is $$\left. \frac{\delta H}{\delta \phi} \right|_{\varphi_i},$$

i.e., it is the Frechet derivative of the cost function H. Furthermore, in some embodiments Δ(H) is the direction of steepest descent for minimizing or optimizing H by changing ϕ. Furthermore, in some embodiments a $1^{st}$ order and/or a $3^{rd}$ order Runge-Kutta method is used when updating $\phi_i$. In other embodiments, a Conjugate Gradient technique, a Levenberg-Marquardt technique, a Quasi-Newton technique, and/or a Simplex technique may be used.

At least some aspects of Simulated Annealing may be utilized in some embodiments of inverse optical calculation 1000. In particular, the cost function H may be allowed to increase during some steps as the calculation evolves. In this way, the global minimum in the multi-dimensional space may be determined. Note that the size of this multi-dimensional space may be a number of quantization levels to the power of the number of pixels in the mask pattern. In an exemplary embodiment, the mask pattern or image has at least 1 million pixels (for example, 1024×1024).

In one embodiment, in any iteration of inverse optical calculation 1000, changes in ϕ that decrease or increase the cost function (H) up to 0.5% are performed. If a larger change will result (e.g., ΔH>0.5%), the step size Δt may be decreased by a factor that is at least greater than 1 and the change in ϕ is implemented (or not) based on a probability and a value P given by $$e^{\frac{-kH_{i+1}}{H_i}},$$

$H_{i+1}$ is the cost function in the $i+1^{th}$ iteration (if the change in ϕ is implemented) and $H_i$ is the cost function in $i^{th}$ iteration (note that the ratio of $H_{i+1}/H_i$ equals 1+ΔH). In some embodiments k is 0.155. For example, if the value P is 0.3 and the probability is a random (or pseudorandom) number between 0 and 1 that is less than P, the cost function may be increased before proceeding. In this way, inverse optical calculation 1000 initially takes large steps and thereby explores the solution space.

In some embodiments, inverse optical calculation 1000 is run for 100, 1000 or 10,000 iterations at which point the optimal solution has been determined. In other embodiments, the calculation is stopped based on convergence criteria, such as oscillatory behavior, a relative and/or absolute difference between the input image (such as an inspection image) and images that result when a reconstructed pattern is projected through optical path 1012, the latest change to the cost function H, and/or the history of changes to the cost function H. For example, the relative difference may be less than 1% and/or the absolute difference may be 10 nm for a critical dimension of 100 nm. Note that in some embodiments, the level-set function is re-distanced (i.e., restored to one having a distance function property relative to an edge or contour in the pattern) at intermediate iterations during inverse optical calculation 1000. In an exemplary embodiment, such re-distancing occurs at least every 20 iterations (for example, every 14 iterations).

Figure 11:
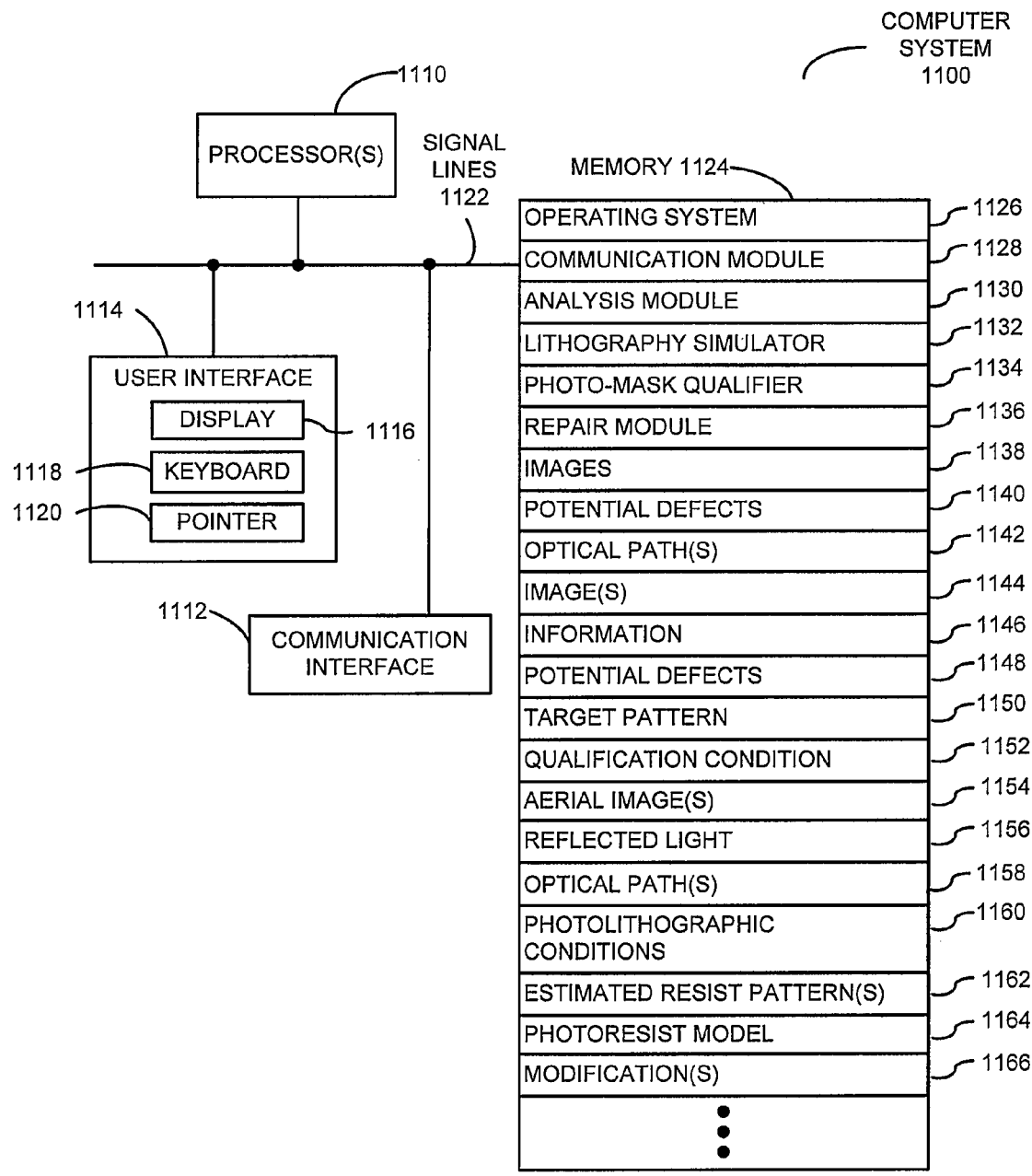
FIG. 11 is a block diagram illustrating a computer system in accordance with an embodiment of the present invention.

We now discuss computer systems for implementing the inspection and qualification technique. FIG. 11 presents a block diagram illustrating a computer system 1100. Computer system 1100 includes one or more processors 1110, a communication interface 1112, a user interface 1114, and one or more signal lines 1122 coupling these components together. Note that the one or more processing units 1110 may support parallel processing and/or multi-threaded operation, the communication interface 1112 may have a persistent communication connection, and the one or more signal lines 1122 may constitute a communication bus. Moreover, the user interface 1114 may include a display 1116, a keyboard 1118, and/or a pointer 1120, such as a mouse.

Memory 1124 in the computer system 1100 may include volatile memory and/or non-volatile memory. More specifically, memory 1124 may include ROM, RAM, EPROM, EEPROM, flash, one or more smart cards, one or more magnetic disc storage devices, and/or one or more optical storage devices. Memory 1124 may store an operating system 1126 that includes procedures (or a set of instructions) for handling various basic system services for performing hardware dependent tasks. The memory 1124 may also store procedures (or a set of instructions) in a communication module 1128. The communication procedures may be used for communicating with one or more computers and/or servers, including computers and/or servers that are remotely located with respect to the computer system 1100.

Memory 1124 may also include multiple program modules (or a set of instructions), including: analysis module 1130 (or a set of instructions), lithography simulator 1132 (or a set of instructions), photo-mask qualifier 1134 (or a set of instructions), and/or repair module 1136 (or a set of instructions). Note that one or more of these program modules (or sets of instructions) may constitute a computer-program mechanism. Furthermore, note that one or more of these program modules (or sets of instructions) may be implemented as a stand-alone software application, or as a program module or subroutine in another application, such as photo-mask inspection software and/or software in a photo-mask repair system.

During operation of computer system 1100, analysis module 1130 may measure images 1138 of a substrate and a blank in an EUV photo-mask. Then, analysis module 1130 may identify potential defects 1140 based on images 1138. These potential defects may be identified using an inverse optical calculation and one or more models of optical paths 1142.

Moreover, analysis module 1130 may measure one or more images 1144 of the EUV photo-mask that includes a mask pattern defined in an absorption layer. Note that images 1144 may be measured based on information 1146, such as locations of potential defects 1140.

Next, analysis module 1130 may identify potential defects 1148 in the EUV photo-mask based on the one or more images 1144 and potential defects 1140. For example, analysis module 1130 may identify potential defects 1148 based on comparison with a target pattern 1150 (such as a target mask pattern or portions of a circuit).

Based on potential defects 1140 and potential defects 1148, photo-mask qualifier 1134 determines qualification condition 1152 of the EUV photo-mask. Note that qualifying the EUV photo-mask may involve lithography simulator 1132 performing a forward optical calculation to assess printability of potential defects 1140 and potential defects 1148 on a semiconductor wafer at an image plane of a model of an optical system associated with a photo-lithographic process. For example, lithography simulator 1132 may calculate one or more aerial image(s) 1154 in the forward optical calculation using reflected light 1156 and information about one of optical paths 1158 associated with the photo-lithographic process. This calculation may also use photolithographic conditions 1160. Furthermore, lithography simulator 1132 may calculate estimated resist pattern(s) 1162 using one or more aerial image(s) 1154 and a photoresist model 1164.

In some embodiments, repair module 1136 optionally determines one or more modifications 1166 to the EUV photo-mask based on potential defects 1140 and potential defects 1148. For example, the modification may involve an additive process (such as depositing another layer or an additional material on the photo-mask) and/or a subtractive process (such as etching).

The one or more modification(s) 1166 may be used to modify or repair the EUV photo-mask. For example, information or instructions associated with the one or more modifications 1166 may be provided by computer system 1100 to a photo-mask repair system. Alternatively, repair module 1136 may modify the EUV photo-mask based on the one or more modifications 1166. In some embodiments, prior to modifying the EUV photo-mask, repair module 1136 decomposes the one or more modification(s) 1166 into an etching modification to the EUV photo-mask and/or a deposition modification to the EUV photo-mask.

Instructions in the various modules in memory 1124 may be implemented in a high-level procedural language, an object-oriented programming language, and/or in an assembly or machine language. The programming language may be compiled or interpreted, i.e., configurable or configured to be executed, by the one or more processing units 1110.

In some embodiments, at least some of the information in memory 1124 is encrypted. For example, the lithographic simulator 1132 and/or its output files (such as estimated resist pattern(s) 1150) may be encrypted. Furthermore, information 'stored' in memory 1124 in FIG. 11 may be stored locally and/or at remote locations.

Although the computer system 1100 is illustrated as having a number of discrete items, FIG. 11 is intended to be a functional description of the various features that may be present in the computer system 1100 rather than as a structural schematic of the embodiments described herein. In practice, and as recognized by those of ordinary skill in the art, the functions of the computer system 1100 may be distributed over a large number of servers or computers, with various groups of the servers or computers performing particular subsets of the functions. In some embodiments, some or all of the functionality of the computer system 1100 may be implemented in one or more ASICs, one or more field programmable gate arrays (FPGAs), and/or one or more digital signal processors (DSPs). In some embodiments the functionality of the computer system 1100 may be implemented more in hardware and less in software, or less in hardware and more in software, as is known in the art.

In the preceding discussion, a 'computer system' may include a variety of devices, such as: a personal computer, a laptop computer, a tablet computer, a mainframe computer, a portable electronic device, a server and/or a client computer (in a client-server architecture), and/or other device capable of manipulating computer-readable data or communicating such data between two or more computing systems over a network (such as the Internet, an Intranet, a LAN, a WAN, a MAN, or combination of networks, or other technology enabling communication between computing systems).

One or more of the preceding embodiments may include fewer or additional components. Furthermore, in one or more of the preceding embodiments two or more components may be combined into a single component and/or a position of one or more components may be changed.

In the preceding description, we refer to 'some embodiments.' Note that 'some embodiments' describes a subset of all of the possible embodiments, but does not always specify the same subset of embodiments.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A computer-implemented method for determining a qualification condition of an extreme ultra-violet (EUV) photo-mask, comprising:
   measuring a first image of a substrate and a second image of a blank that includes multiple layers deposited on the substrate;
   identifying first potential defects on the substrate, in the multiple layers or both based on the first image and the second image;
   measuring a third image of the EUV photo-mask that includes a mask pattern defined in an absorption layer, which is deposited on top of the multiple layers, wherein measurement of the third image uses information associated with the first potential defects;
   identifying second potential defects in the EUV photo-mask based on the third image and the first potential defects; and
   determining the qualification condition of the EUV photo-mask based on the first potential defects and the second potential defects.

2. The method of claim 1, wherein the second image includes multiple optical microscope images that are obtained using different focal lengths or light polarizations.

3. The method of claim 1, wherein the second image includes multiple confocal microscope images.

4. The method of claim 1, wherein the second image includes an aerial image associated with the blank.

5. The method of claim 1, wherein the second image includes an image of a test-wafer pattern produced using the blank.

6. The method of claim 1, wherein identifying the first potential defects involves a first inverse optical calculation based on the first image and a second inverse optical calculation based on the second image;
   wherein the first image is at an image plane of a first model of a first optical system in the first inverse optical calculation and the second image is at the image plane of a second model of a second optical system in the second inverse optical calculation; and
   wherein the first model of the first optical system corresponds to a first measurement system that measured the first image and the second model of the second optical system corresponds to a second measurement system that measured the second image.

7. The method of claim 6, wherein measurement of the third image involves alignment with the first image and the second image based on the information associated with the first potential defects; and
   wherein the information includes masking of at least some of the first potential defects in the third image by the absorption layer.

8. The method of claim 7, wherein the information includes locations of the first potential defects.

9. The method of claim 1, wherein qualifying the EUV photo-mask involves a forward optical calculation to assess printability of the first potential defects and the second potential defects on a semiconductor wafer at an image plane of a model of an optical system associated with a photo-lithographic process.

10. The method of claim 1, wherein the method further involves determining a modification to the EUV photo-mask based on the first potential defects and the second potential defects.

11. The method of claim 9, wherein the modification involves a change in the mask pattern.

12. A computer-program product for use in conjunction with a computer system, the computer-program product comprising a non-transitory computer-readable storage medium and a computer-program mechanism embedded therein for determining a qualification condition of an EUV photo-mask, the computer-program mechanism including:
    instructions for measuring a first image of a substrate and a second image of a blank that includes multiple layers deposited on the substrate;
    instructions for identifying first potential defects on the substrate, in the multiple layers or both based on the first image and the second image;
    instructions for measuring a third image of the EUV photo-mask that includes a mask pattern defined in an absorption layer, which is deposited on top of the multiple layers, wherein measurement of the third image uses information associated with the first potential defects; and
    instructions for identifying second potential defects in the EUV photo-mask based on the third image and the first potential defects; and
    instructions for determining the qualification condition of the EUV photo-mask based on the first potential defects and the second potential defects.

13. The computer-program product of claim 12, wherein the second image includes multiple optical microscope images that are obtained using different focal lengths or light polarizations.

14. The computer-program product of claim 12, wherein the second image includes multiple confocal microscope images.

15. The computer-program product of claim 12, wherein the second image includes an aerial image associated with the blank.

16. The computer-program product of claim 12, wherein identifying the first potential defects involves a first inverse optical calculation based on the first image and a second inverse optical calculation based on the second image;
    wherein the first image is at an image plane of a first model of a first optical system in the first inverse optical calculation and the second image is at the image plane of a second model of a second optical system in the second inverse optical calculation; and
    wherein the first model of the first optical system corresponds to a first measurement system that measured the first image and the second model of the second optical system corresponds to a second measurement system that measured the second image.

17. The computer-program product of claim 16, wherein measurement of the third image involves alignment with the first image and the second image based on the information associated with the first potential defects and wherein the information includes masking of at least some of the first potential defects in the third image by the absorption layer.

18. The computer-program product of claim 12, wherein qualifying the EUV photo-mask involves a forward optical calculation to assess printability of the first potential defects and the second potential defects on a semiconductor wafer at an image plane of a model of an optical system associated with a photo-lithographic process.

19. The computer-program product of claim 12, wherein the computer-program mechanism further includes instructions for determining a modification to the EUV photo-mask based on the first potential defects and the second potential defects.

20. A computer system, comprising:
a processor;
a memory; and
a program module for determining a source pattern to illuminate a photo-mask during a photolithographic process, the program module stored in the memory and configured to be executed by the processor, wherein the program module is configured to determine a qualification condition of an EUV photo-mask, the program module including:
instructions for measuring a first image of a substrate and a second image of a blank that includes multiple layers deposited on the substrate;
instructions for identifying first potential defects on the substrate, in the multiple layers or both based on the first image and the second image;
instructions for measuring a third image of the EUV photo-mask that includes a mask pattern defined in an absorption layer, which is deposited on top of the multiple layers, wherein measurement of the third image uses information associated with the first potential defects;
instructions for identifying second potential defects in the EUV photo-mask based on the third image and the first potential defects; and
instructions for determining the qualification condition of the EUV photo-mask based on the first potential defects and the second potential defects.

* * * * *